Sept. 2, 1958 J. P. HAMMES 2,850,687

SEMICONDUCTOR DEVICES

Filed Oct. 13, 1953

INVENTOR.
JOHN P. HAMMES

BY J. L. Whittaker
ATTORNEY

United States Patent Office 2,850,687

Patented Sept. 2, 1958

2,850,687

SEMICONDUCTOR DEVICES

John P. Hammes, Nutley, N. J., assignor to Radio Corporation of America, a corporation of Delaware Application October 13, 1953, Serial No. 385,776

15 Claims. (Cl. 317—235)

This invention pertains to potting materials particularly useful for delicate electronic devices, to improved compositions comprising these potting materials and to improved apparatus including the materials.

One type of apparatus or device to which the principles of the invention may be applied is known as a transistor. A typical transistor comprises a body of semiconductor material having base, emitter and collector electrodes mounted in operative relationship therewith. Electrical leads are connected to each of these electrodes. In such devices, the emitter and collector electrodes may be point or other small-area electrodes or they may be P–N junction electrodes. In the point contact type transistor device, the electrodes are mounted in contact with the semiconductor body and maintained at very accurate spacing by light pressure. This type of construction is unstable and the electrodes may be displaced by relatively small mechanical shocks.

In one type of transistor construction, the electrical leads connected to the collector, emitter, and base electrodes comprise stiff wires which are sealed in and extend through an insulating support member of glass or the like. The support member is known as the stem of the transistor and is generally of glass and includes two oppositely disposed surfaces which are generally substantially plane and parallel. When the leads are connected to the base, emitter and collector electrodes, they thus provide support for and electrical connection to the transistor. In this construction, after the transistor has been thus mounted, it is embedded in one or more protective media of wax, plastic or the like, a portion of which is in contact with one of the aforementioned two surfaces of the stem. This embedding has been found desirable, not only to protect the active surfaces of the device against the harmful effects of moisture and other atmospheric components but to provide stability against the effects of mechanical shocks.

Problems arise in this type of construction, however, and particularly in the point contact devices, due to the differential shrinkage between the plastic protective material and the glass base, the metal contact electrodes or other parts of the device. One particularly serious problem is cracking of the glass support member. Another problem is distortion or displacement of the transistor electrodes or leads connected thereto which results in deterioration in the operational efficiency or failure of the device.

Accordingly, an important object of this invention is to provide a novel and improved potting arrangement for mechanical or electrical apparatus or the like.

Another object is to provide an improved potting medium for mechanical or electrical apparatus or the like.

Another object of this invention is to provide a semiconductor device of new and improved construction.

Another object is to provide an improved transistor construction including an improved protective embedding medium for the transistor.

A further object is to provide an improved transistor construction less subject to stress due to differential shrinkage of the components parts thereof.

In general, the purposes and objects of this invention are accomplished by the provision of an improved potting medium for mechanical or electrical apparatus or the like. The improved medium comprises a plastic material, such as a synthetic resin, having distributed therethrough substantially spherical pellets of another material. The pellets may be metallic or insulating. The function of the pellets is to modify the coefficient of expansion of the plastic without materially changing its viscosity and workability. A potting material thus prepared may be employed to embed and protect selected portions or all of substantially any type of mechanical or electrical apparatus or the like. Such a material may also be employed merely as an insulating coating or the like where such is required.

The invention is described in greater detail by reference to the drawing wherein.

Figure 1:
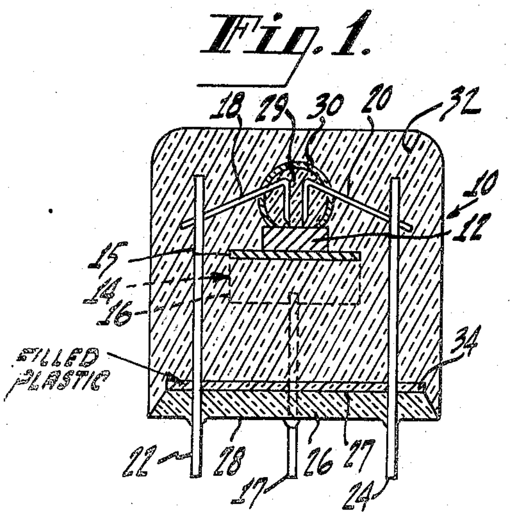
Fig. 1 is an elevational view, partly in section, of a semiconductor device prepared according to the invention.

Referring to Figure 1, there is illustrated one type of device 10 in which the principles of this invention may be embodied. The device is known as a transistor and comprises a block or crystal 12 of semiconductor material, for example germanium or silicon of N-type or P-type conductivity, soldered in low resistance, or ohmic contact, to a metallic supporting member 14 which comprises the base electrode of the completed transistor. The member 14 may be of brass or the like and may be generally L or T shaped including a crystal supporting portion 15 and a portion 16 depending at right angles thereto. A stiff wire or pin 17 of conducting material such as nickel is soldered or otherwise secured to the depending portion of the member 14 to provide electrical contact with the block 12.

The transistor 10 also includes point contact electrodes 18 and 20 which are operated as the emitter and collector electrodes in the completed device and which consist of fine wires having sharpened contact points. Wires 18 and 20, may, for example, be of steel, tungsten or Phosphor bronze or the like and may have a diameter of a few mils and a point diameter of the order of two tenths of a mil. The wires are soldered or welded to supporting wires 22 and 24, which may also be of nickel or some similar conductive material.

The supporting wires 17, 22, and 24 are mounted on an insulating supporting member or stem 26 which may be of glass, plastic, or the like, through which the wires extend. The stem 26 has two substantially parallel planar surfaces 27 and 28. The ends of the wires extending below the member 26 may be used as electrical contact terminals or pins and they may be spaced in such a manner that they will fit, for example, a sub-miniature tube socket.

In order to protect the germanium crystal 12 and its associated electrodes 14, 18, 20, a matrix 29 comprising an organic medium is molded around the crystal and the electrodes. The medium 29 is such that, when set, it is resilient and functions to prevent mechanical distortion of the various components. It is desirable for the organic matrix to be resistant to moisture, and to be inert with respect to the other materials employed in the device and in preparation of the device. Suitable materials for this matrix are waxes, such as paraffin wax, opal wax, ceresin wax paratac, and petrolatum. Polymers of isobutylene having the desired characteristics may also be employed. The resilient protective medium 29 may be applied in any suitable manner, for example, by softening the material and molding a quantity thereof around the elements to be protected.

Next, the protective matrix 29 is covered with a layer 30 of a material which sets to provide a hard, protective coating around the matrix 29. One such material is coil dope which comprises a solution of polystyrene in toluol. The hardened coating of coil dope surrounds the wax 29 and, among other things, protects the wax from heat thereby facilitating succeeding operations. The coil dope may be applied by a dipping operation or in any other suitable fashion.

In this first embodiment of the invention represented in Figure 1, the transistor 10 is potted in a protective organic medium 32 which is intended to impart structural strength to the transistor and, at the same time, protect the transistor from moisture, heat, and the like. A problem arises, however, when the stem 26 is of glass, for example, due to the difference in the thermal coefficients of expansion of the potting material 32 and the stem which is in contact with the potting material along one surface, e. g. 27. Ordinarily, the potting material is fluid and hot when the potting operation is performed. When the potting material cools and sets, strains are set up in the surface 27 of the glass stem contacted thereby and cracks develop in the opposite surface 28. The transistor is thus rendered useless.

According to the invention, in order to overcome the differences in expansion coefficients of the potting material 32 and the glass stem 26 and to prevent cracking of the latter, a layer 34 of insulating material having a coefficient of expansion intermediate between that of the glass stem 26 and the potting material 32 is painted or otherwise applied to the surface 27 of the glass stem before the transistor is potted. This material having an intermediate coefficient of expansion may conveniently be the same as the transistor potting material 32 which is treated according to the invention to alter its thermal coefficient of expansion.

The potting material 32 may be any suitable substance which has a coefficient of expansion comparable to those of the various components of the transistors, i. e. the stem 26 and the various electrodes. One suitable class of materials suitable for the purposes of this invention are synthetic resins known as the Araldites. In general, it may be stated that "Araldites" are condensation products of poly-arylepoxy-ethane compounds and derivatives of such polymers and they include varieties which harden at room temperature and others which are cured and set at elevated temperatures. The mechanical and chemical properties of Araldite have been described in a paper by Preiswerk, Meyerhans and Denz, which appears in "Materials and Methods," October 1949, and by Preiswerk and Meyerhans in "Eletcrical Manufacturing," July 1949. Further information on the chemical composition of Araldite will be found in a paper by Ott which appears in "Schweizer Archiv," January 1949, pages 23–31 (a translation of this paper has been published by The Technical Service Department, Aero Research Limited, Duxford, Cambridge, England, which is entitled "Aero Research Technical Notes," Bulletin No. 75, March 1949). In this connection reference is made to the Patents 2,324,483 and 2,444,333 to Castan which disclose examples of Araldite resins.

The material of the layer 34 may be the above-described Araldite resin having mixed therewith a filler of pellets of insulating material, for example of glass, plastic or the like which are substantially spherical in form. The coefficient of expansion of a layer of this composition is lower than that of the resin, alone. For the purposes of this invention, the spheres preferably have a diameter in the range of 10 to 80 microns. A sufficient number of the smallest spheres are provided to fill the interstices between the largest spheres. By this means, the maximum amount of filler may be provided to achieve maximum reduction in thermal coefficient of expansion while retaining desirably low viscosity and workability of the resin. The glass spheres may be added in an amount up to 80% by weight with the range of 50% to 80% by weight being preferred for the type of device described above. One suitable method of achieving the desired distribution of filler according to size is to prepare a first quantity of pellets having diameters in the range of 10 to 30 microns and a second quantity of pellets having diameters in the range of 30 to 80 microns. One suitable mixture is three parts of the small spheres to one part of the large spheres. For Araldite CN501, glass filler of 10 to 80 microns in diameter in an amount 50% by weight reduces the thermal coefficient of expansion from about $50\times10^{-6}$ units/unit/° C. to about $27\times10^{-6}$ units/unit/° C.

It is desirable to pot or embed point contact transistors in a type of Araldite, e. g. CN501, which is cured and sets at an elevated temperature. Such an Araldite is more stable and more favorable for use with delicate point contact devices. This material may be used both for the layer 34 and the medium 32.

In a typical example, the layer 34 is painted on the stem 26 and then the transistor is potted in the material 32 by any convenient method. Suitable methods for forming the protective Araldite medium around the transistor are described in a co-pending application of B. N. Slade and G. M. Rose, Serial Number 223,547, filed April 28, 1951, and assigned to the assignee of this application, now abandoned. According to one method described in that application, a mold is placed over the transistor and in engagement with the stem. The mold is provided with an opening through which liquid resin with an included hardener is poured until the mold is filled. The resin is then cured by being heated in an oven at a temperature of between 105° C. and 150° C. for a time between 24 and 72 hours.

After the transistor has been removed from the oven, it is cooled in air and the collector electrode is electrically formed by a pulsing operation. Other processing operations may be performed as required until the transistor is ready for use.

In the construction shown in Figure 1, the protective resilient medium 28 and its confining layer 30 are employed to provide, among other things, structural rigidity for the crystal and point contact electrodes. If this protection is not provided and the transistor is potted directly in the medium 32, differences in the coefficients of expansion of the potting material and the crystal and its associated electrodes may upset the desired structural relationship between these components. The embodiment of the invention shown in Figure 2 improves and simplifies the transistor construction while retaining all of the advantages of the device shown in Figure 1.

Figure 2:
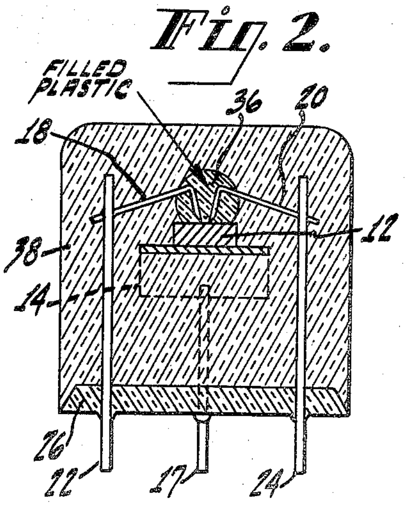
Fig. 2 is an elevational view, partly in section, of a first modification of the device of Figure 1.

In the embodiment of the invention shown in Figure 2, the components of the transistor are assembled and mounted on the glass stem 26 as in Figure 1. In this embodiment, however, a quantity of the glass-filled resin 36, is molded around the crystal 12 and electrodes 18 and 20. The entire unit is then potted, as outlined above, in a resinous medium 38, which may also be Araldite. In this instance, the potting medium 38 may be room-temperature-setting Araldite since the crystal and electrodes are adequately protected and the Araldite resin characteristics are thus less critical. The use of room-temperature-setting Araldite eliminates the problem of cracking of the stem 26 since the resin is not cured at and elevated temperature and, as a result, the layer 34 shown in Figure 1 may be omitted. If desired, to provide added protection for the quantity of resin 36, the film 30 of coil dope may be provided as in the device in Figure 1.

Figures 3, 4:
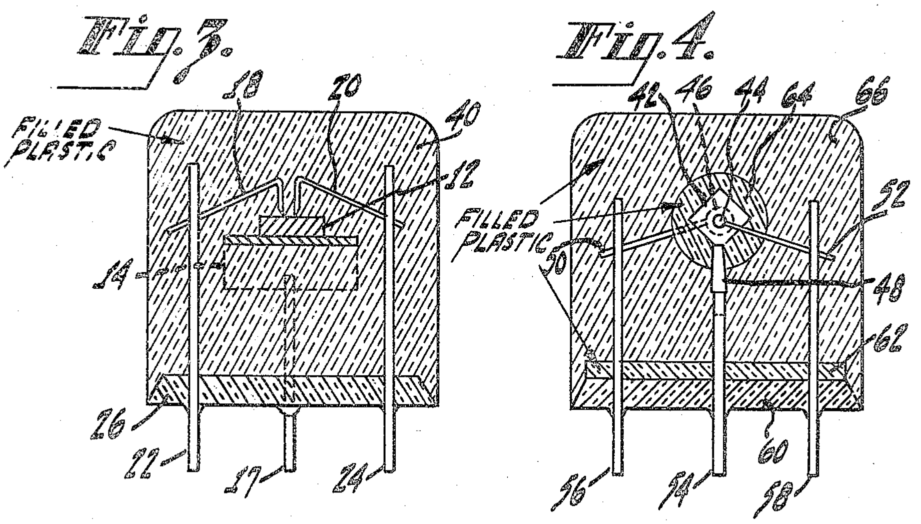
Fig. 3 is an elevational view, partly in section, of a second modification of the device of Figure 1; and, Fig. 4 is an elevational view, partly in section, of a third modification of the device of Fig. 1.

In a third embodiment of the invention shown in Figure 3, the device 10 is potted entirely in a glass-filled resin 40, which may be Araldite, without any preliminary coating or embedding of the stem or the crystal-electrode assembly. This construction reduces the assembly procedure by at least two steps and provides, at the same time, an efficient, structurally-strong transistor. In this embodiment of the invention, it may be desirable to employ a filler of spheres of a thermally conductive, electrically insulating material such as oxidized nickel or the like. This construction provides the additional advantage of promoting cooling of the transistor. This type of thermally conductive filler may also be employed in the devices shown in Figures 1, 2, and 4. Thermally and electrically conductive pellets may also be used in devices having component parts properly insulated to prevent a short circuit between them.

The principles of the invention may also be applied to P–N junction transistors wherever problems arise similar to those found in point contact transistors. A typical P–N junction transistor is shown in Figure 4. This device includes a semiconductor crystal 42 having, for example, emitter and collector P–N junction electrodes, 44 and 46, respectively, formed in opposite surfaces thereof. Such electrodes may be formed, for example, by an alloying procedure such as that described in an article entitled "A developmental germanium P–N–P junction transistor" in the Proceedings of the I. R. E. of November 1952. An alloying procedure is also described in a co-pending U. S. patent application of C. W. Mueller, Serial Number 295,304, filed June 24, 1952, and assigned to the assignee of this application.

A base electrode tab 48 is soldered in ohmic contact to the crystal, and lead wires 50 and 52 are soldered to portions of the P–N junction electrodes 46 and 44 respectively. Conductive support rods 54, 56, 58 are sealed in a glass support stem 60 and are welded or otherwise connected to the base electrode 48 and lead wires 50, 52 respectively. According to the invention, where necessary and appropriate, the glass filled resin may be applied as a layer 62 to one surface of the glass stem or as a matrix 64 around the crystal or in both places. Or, alternatively, the entire device may be potted in glass-filled resin 66.

Of course, the principles of the invention may also be applied to diodes or to semiconductor devices having three or more rectifying electrodes and two or more base electrodes. And as aforementioned, devices other than electrical devices may be prepared according to the teaching of the invention.

What is claimed is:

1. In an apparatus comprising an electrical device having a plurality of component parts and a protective medium molded around said device, and wherein the coefficients of expansion of said medium and at least one of said component parts are substantially different, the improvement wherein said medium comprises an electrically insulating plastic carrier and a filler of pellets substantially spherical in form, said pellets being of a material having a coefficient of expansion intermediate the coefficients of expansion of said medium and said one of said component parts, said filler being present in an amount up to 80% by weight.

2. The apparatus defined in claim 1 wherein said pellets are of glass and have a diameter in the range of 10 to 80 microns and said pellets are present in an amount up to 80% by weight.

3. The apparatus defined in claim 1 wherein said filler is present in an amount in the range of 50% to 80% by weight.

4. The apparatus defined in claim 1 wherein said pellets have a diameter in the range of 10 to 80 microns.

5. In a semiconductor device including a semiconductor crystal and at least one rectifying electrode in operative relation therewith, a quantity of an electrically insulating, plastic protective medium associated with at least a portion of said device, said medium including a filler of small, substantially spherical pellets of a material having a coefficient of expansion intermediate the coefficients of expansion of said plastic medium and said portion of said device.

6. A semiconductor device comprising a transistor assembly including a body of semiconducting material and at least one rectifying electrode in operative relation with said body, and a quantity of an electrically insulating, plastic protective medium associated with at least a portion of said assembly, said medium including a filler of small, substantially spherical pellets of a material having a coefficient of expansion intermediate the coefficients of expansion of said plastic medium and said portion of said assembly.

7. A semiconductor device comprising a body of semiconductor material, at least one rectifying electrode in operative relation with said body, electrically conductive support rods connected to said body and electrodes, an insulating support member carrying said support rods, insulating plastic protective material surrounding and embedding said body, electrodes and a portion of said support member, at least a portion of said material including a filler of spheres of an insulating substance whose coefficient of expansion is intermediate the coefficients of expansion of said portion of said support member and said plastic material.

8. A semiconductor device comprising a body of semiconductor material, at least one rectifying electrode in operative relation with said body, electrically conductive support rods connected to said body and electrode, an insulating support member carrying said support rods, a layer of insulating material on said support member including a filler of spherical pellets of insulating material, and a protective organic medium surrounding and embedding said body and electrode, said medium also being contiguous with said layer.

9. A semiconductor device comprising a body of semiconductor material, at least one rectifying electrode in operative relation with said body, electrically conductive support rods connected to said body and electrode, an insulating support member carrying said support rods, a layer of synthetic resinous material on said support member including a filler of spherical glass pellets, and a synthetic resinous medium surrounding and embedding said body and electrode, said medium also being contiguous with said layer.

10. A semiconductor device comprising a body of semiconductor material, at least one rectifying electrode in operative relation with said body, an insulating, plastic protective medium surrounding and embedding said body and at least a portion of said electrode, said medium including a filler of spherical pellets of insulating material whose coefficient of expansion is intermediate the coefficients of expansion of said portion of said electrode and said plastic medium.

11. A semiconductor device comprising a body of semiconductor material, at least one rectifying electrode in operative relation with said body, a protective synthetic resinous medium surrounding and embedding said body and at least a portion of said electrode, said medium including a filler of spherical pellets of thermally conductive material whose coefficient of expansion is intermediate the coefficients of expansion of said resinous medium and said portion of said electrode.

12. A semiconductor device comprising a body of semiconductor material, a fine wire electrode in rectifying contact with said body and a quantity of an electrically insulating plastic material surrounding a portion of said electrode and in contact with said body, said plastic material including a filler of spheres of an insulating material such that the coefficient of expansion of the combination of said plastic and said filler is intermediate the coefficients of expansion of said electrode and said plastic material.

13. A semiconductor device comprising a body of semiconductor material, a pair of fine wire electrodes in rectifying contact with said body and spaced apart a critical distance, and a quantity of an electrically insulating plastic material surrounding a portion of said electrodes and in contact with said body, said plastic material including a filler of spheres of an insulating material such that the coefficient of expansion of the combination of said plastic and said filler is intermediate the coefficients of expansion of said electrodes and said plastic material.

14. In an apparatus comprising an electrical device having a plurality of component parts and a protective medium molded around said device, the coefficients of expansion of said medium and at least one of said component parts being substantially different, the improvement wherein said medium comprises a plastic carrier and a filler of pellets, said pellets being of a material having a coefficient of expansion intermediate the coefficients of expansion of said medium and said one of said component parts.

15. In a semiconductor device including a semiconductor crystal and at letst one rectifying electrode in operative relation therewith, a quantity of a plastic protective medium associated with at least a portion of said device, said medium including a filler of pellets of a material whose coefficient of expansion is intermediate the coefficients of expansion of said plastic medium and said portion of said device.

References Cited in the file of this patent

UNITED STATES PATENTS

| | | |
|---|---|---|
| 2,010,133 | Bloomenthal | Aug. 6, 1935 |
| 2,354,049 | Palmquist | July 18, 1944 |
| 2,606,960 | Little | Aug. 12, 1952 |
| 2,676,892 | McLaughlin | Apr. 27, 1954 |
| 2,688,110 | Domaleski | Aug. 31, 1954 |
| 2,704,340 | Baird | Mar. 15, 1955 |
| 2,705,768 | Kleimack | Apr. 5, 1955 |
| 2,735,050 | Armstrong | Feb. 14, 1956 |
| 2,745,045 | Ingraham | May 8, 1956 |
| 2,753,495 | Barry | July 3, 1956 |

FOREIGN PATENTS

| | | |
|---|---|---|
| 175,239 | Great Britain | Nov. 16, 1922 |

OTHER REFERENCES

Slade, Abstract, Ser. No. 223,547, published September 8, 1953.